(12) United States Patent
Yu et al.

(10) Patent No.: US 6,352,620 B2
(45) Date of Patent: *Mar. 5, 2002

(54) STAGED ALUMINUM DEPOSITION PROCESS FOR FILLING VIAS

(75) Inventors: Sang-Ho Yu, Sunnyvale; Yonghwa Chris Cha, San Jose; Murali Abburi, Santa Clara; Shri Singhvi, Milpitas; Fufa Chen, Cupertino, all of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/340,977

(22) Filed: Jun. 28, 1999

(51) Int. Cl.$^7$ ................................. C23L 14/34
(52) U.S. Cl. ............................ 204/192.15; 204/192.12; 204/298.02; 427/250; 427/255.7; 118/719
(58) Field of Search ........................ 204/192.12, 192.15, 204/192.22, 192.23, 298.25, 298.02; 427/250, 255.7; 118/719

(56) References Cited

U.S. PATENT DOCUMENTS

| 5,371,042 A | | 12/1994 | Ong ............................ 437/194 |
| 5,658,438 A | | 8/1997 | Givens et al. .......... 204/192.11 |
| 5,665,659 A | | 9/1997 | Lee et al. .................... 438/646 |
| 5,725,739 A | * | 3/1998 | Hu ........................... 204/192.3 |
| 5,798,301 A | | 8/1998 | Lee et al. .................... 438/653 |
| 5,877,087 A | * | 3/1999 | Mosely et al. ............... 438/656 |
| 6,045,666 A | * | 4/2000 | Satitpunwaycha et al. ....... 204/192.17 |

FOREIGN PATENT DOCUMENTS

| EP | 0 586 803 | | 3/1994 | ........... H01L/21/90 |
| EP | 0 692 551 | | 1/1996 | ........... C23C/14/04 |
| EP | 0 721 216 | | 7/1996 | ......... H01L/23/532 |
| EP | 856884 | * | 8/1998 | ......... H01L/24/768 |
| EP | 1 039 531 | | 9/2000 | ......... H01L/21/768 |

OTHER PUBLICATIONS

"Thin Film Processes" by Vossen et al., p. 382, Dec. 1978.*
"Thin Film Processes" by Vossen et al., p. 153, Dec. 1978.*
Search Report for EP No. 00113013.7, dated Apr. 6, 2001.
G. Yao, et al., "Advanced Warm Aluminum For 0.25 $\mu$m Technologies," Technical Symposium, Semicon Korea, 1999.
G. Yao, et al., "Advanced Aluminum Planarization Solutions For Sub 0.25 $\mu$m Technologies," Technical Symposium, Semicon Korea, 1999.

* cited by examiner

Primary Examiner—Nam Nguyen
Assistant Examiner—Steven H. VerSteeg
(74) Attorney, Agent, or Firm—Moser, Patterson, & Sheridan, LLP

(57) ABSTRACT

The present invention is a semiconductor metallization process for providing complete via fill on a substrate and a planar metal surface, wherein the vias are free of voids and the metal surface is free of grooves. In one aspect of the invention, a refractory layer is deposited onto a substrate having high aspect ratio contacts or vias formed thereon. A PVD metal layer, such as PVD Al or PVD Cu, is then deposited onto the refractory layer at a pressure below about 1 milliTorr to provide a conformal PVD metal layer. Then the vias or contacts are filled with metal, such as by reflowing additional metal deposited by physical vapor deposition on the conformal PVD metal layer. The process is preferably carried out in an integrated processing system that includes a long throw PVD chamber, wherein a target and a substrate are separated by a long throw distance of at least 100 mm, and a hot metal PVD chamber that also serves as a reflow chamber.

28 Claims, 4 Drawing Sheets

STAGED ALUMINUM DEPOSITION PROCESS FOR FILLING VIAS

FIELD OF THE INVENTION

The present invention relates to a metallization process for manufacturing semiconductor devices. More particularly, the present invention relates to the metallization of semiconductor substrates having apertures to form void-free interconnections between conducting layers, and planar metal surfaces.

BACKGROUND OF THE INVENTION

Sub-half micron multilevel metallization is one of the key technologies for the next generation of very large scale integration ("VLSI"). The multilevel interconnections that lie at the heart of this technology require planarization of high aspect ratio apertures, including contacts, vias, lines or other features. Reliable formation of these interconnects is very important to the success of VLSI and to the continued effort to increase circuit density and quality on individual substrates and die.

Aluminum (Al) or copper (Cu) layers formed by chemical vapor deposition ("CVD"), like other CVD processes, provide good conformal layers, i.e., a uniform thickness layer on the sides and base of the feature, for very small geometries, including sub-half micron (<0.5 $\mu$m) apertures, at low temperatures. Therefore, CVD processes (CVD Al or CVD Cu) are common methods used to fill apertures. However, transmission electron microscopy data ("TEM") has revealed that voids exist in many of the CVD formed Al apertures even though electric tests of these same apertures do not evidence the existence of this void. If the layer is subsequently processed, the void can result in a defective circuit. It should be recognized that this kind of void is very difficult to detect by regular cross sectional standard electron microscopy ("SEM") techniques, because some deformation occurs in soft aluminum during mechanical polishing. In addition, electric conductivity tests do not detect any structural abnormalities. However, despite generally positive electric conductivity tests, conduction through the contact having the void may, over time, compromise the integrity of the integrated circuit devices.

A TEM study of various CVD Al layers formed on substrates indicates that the formation of voids occurs through a key hole process wherein the top portion of the via becomes sealed before the via has been entirely filled. Although a thin conformal layer of CVD Al can typically be deposited in high aspect ratio contacts and vias at low temperatures, continued CVD deposition to complete filling of the contacts or vias typically results in the formation of voids therein. Extensive efforts have been focused on elimination of voids in metal layers by modifying CVD processing conditions.

An alternative technique for metallization of high aspect ratio apertures, is hot planarization of aluminum through physical vapor deposition ("PVD"). The first step in this process requires deposition of a thin layer of a refractory metal such as titanium (Ti) on a patterned wafer to form a barrier/wetting layer which facilitates flow of the Al during the PVD process. Following deposition of the barrier/wetting layer, the next step requires deposition of either (1) a hot PVD Al layer or (2) a cold PVD Al layer followed by a hot PVD Al layer onto the wetting layer. However, hot PVD Al processes are very sensitive to the quality of the wetting layer, wafer condition, and other processing parameters. Small variations in processing conditions and/or poor coverage of the wetting layer can result in incomplete filling of the contacts or vias, thus creating voids. In order to reliably fill the vias and contacts, hot PVD Al processes must be performed at temperatures above about 450° C. Even at higher temperatures, PVD processes may result in a bridging effect whereby the mouth of the contact or via is closed because the deposition layer formed on the top surface of the substrate and the upper walls of the contact or via join before the floor of the contact or via has been completely filled.

Once a PVD Al layer has been deposited onto the substrate, reflow of the Al may occur by directing ion bombardment towards the substrate itself. Bombarding the substrate with ions causes the metal layer formed on the substrate to reflow. This process typically heats the metal layer as a result of the energy created by the plasma and resulting collisions of ions onto the metal layer. The high temperatures generated in the metal layers formed on the substrate compromises the integrity of devices having sub-half micron geometries. Therefore, heating of the metal layers is disfavored in these applications.

U.S. Pat. No. 5,147,819 ("the '819 patent") discloses a process for filling vias that involves applying a CVD Al layer with a thickness of from 5 percent to 35 percent of the defined contact or via diameter to improve step coverage, then applying a sufficiently thick PVD Al layer to achieve a predetermined overall layer thickness. A high energy laser beam is then used to melt the intermixed CVD Al and PVD Al and thereby achieve improved step coverage and planarization. However, this process requires heating the wafer surface to a temperature no less than 660° C. Such a high temperature is not acceptable for most sub-half micron technology. Furthermore, the use of laser beams scanned over a wafer may affect the reflectivity and uniformity of the metal layer.

Other attempts at filling high aspect ratio sub-half micron contacts and vias using known reflow or planarization processes at lower temperatures have resulted in dewetting of the CVD Al from the silicon dioxide ($SiO_2$) substrate and the formation of discontinuous islands on the side walls of the vias. Furthermore, in order for the CVD Al to resist dewetting at lower temperatures, the thickness of the CVD Al has to be several thousand Angstroms (A). Since ten thousand Angstroms equal one micron, a CVD Al layer of several thousand Angstroms on the walls of a sub-half micron via will completely seal the via and form voids therein.

U.S. Pat. No. 5,665,659, describes a method for forming a metal layer on a semiconductor substrate including depositing a barrier/wetting layer, heat treating the substrate for a predetermined time at an intermediate temperature between 200° C. and 400° C., and then depositing a PVD metal layer on the semiconductor substrate at a temperature below 200° C. and a pressure below about 2 milliTorr. The deposited metal layer is then thermally treated at a temperature between 0.6 $T_m$–1.0 $T_m$ (where $T_m$ is the melting point of the metal layer) to reflow the metal layer. The barrier/wetting layer is heat treated and the metal layer is carefully cooled to reduce formation of grooves on the metal layer surface.

There remains a need for a metallization process for filling apertures, particularly high aspect ratio sub-half micron contacts and vias, with metal such as aluminum. More particularly, it would be desirable to have a PVD process for filling such contacts and vias.

SUMMARY OF THE INVENTION

The present invention provides a metallization process for filling apertures on a substrate. First, a thin refractory layer is deposited on a substrate followed by depositing a PVD metal layer at a pressure less than about 1 milliTorr to form a conformal layer. The conformal PVD metal layer does not fill the apertures. Then a bulk PVD metal is deposited on the substrate and heated to reflow the metal and fill the apertures.

In one aspect of the invention, a barrier layer is deposited onto a substrate having high aspect ratio contacts or vias formed thereon. A titanium or titanium/titanium nitride barrier layer is preferred for deposition of aluminum. A conformal aluminum layer is then deposited onto the barrier layer by physical vapor deposition at a pressure less than about 1 milliTorr, preferably less than about 0.35 milliTorr. The conformal aluminum layer is preferably deposited in a sputtering chamber having a target positioned at least about 100 mm from a substrate. Next, aluminum is deposited by physical vapor deposition onto the conformal aluminum layer and the via is filled by reflow or annealing of the deposited aluminum.

In another aspect of the invention, the metallization process is carried out in an integrated processing system that includes PVD chambers for depositing a metal such as aluminum without the formation of an oxide layer over the aluminum layers. The processing system may also contain reflow chambers, preclean chambers, and barrier layer chambers associated with deposition of the metal layers.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and, therefore, are not to be considered limiting of its scope, for the invention may admit to other equally effective embodiments.

DETAILED DESCRIPTION OF THE INVENTION

Figure 2:
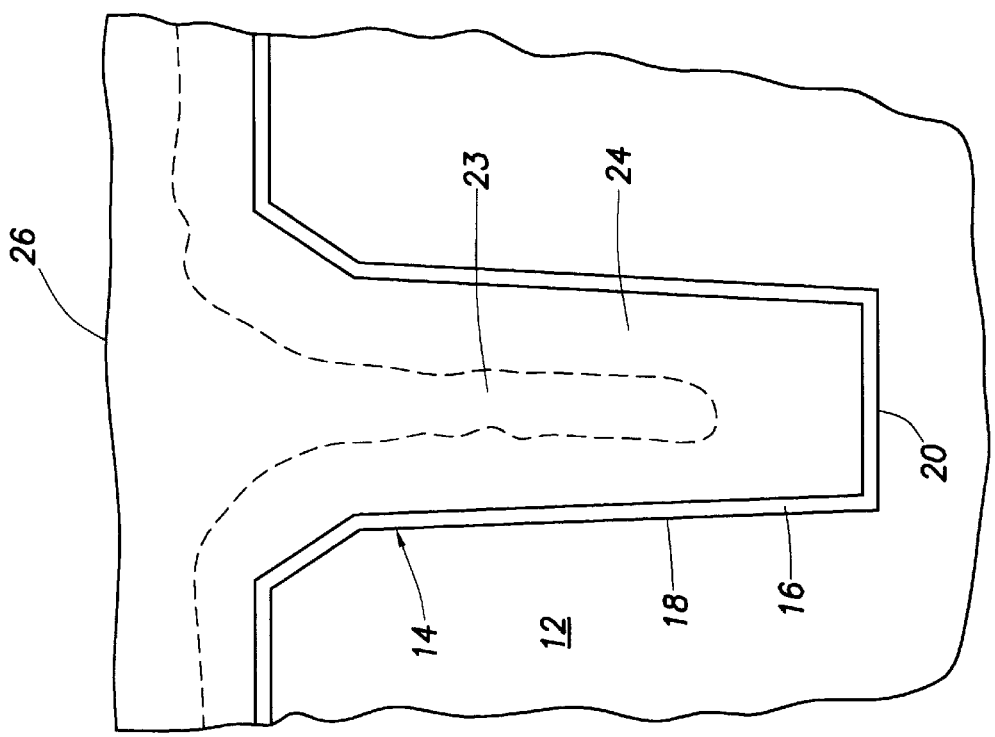
FIG. 2 is a schematic diagram of a metallized semiconductor substrate via according to the present invention having a barrier layer and intermixed PVD layers filling the via.

The present invention provides a method for filling high aspect ratio apertures on semiconductor substrates with metal, particularly sub-micron apertures including contacts, vias, lines, or other features. In particular, the invention provides excellent step coverage for filling high aspect ratio apertures with a conformal layer of metal deposited by PVD at a pressure less than about 1 milliTorr, preferably less than about 0.35 milliTorr, and a metal layer deposited by PVD that is heated to fill the apertures. The conformal PVD metal is preferably deposited on a thin barrier/wetting layer comprised of a refractory metal and/or conductive metal having a melting point greater than that of the conformal PVD metal. A barrier layer, such as titanium (Ti) or tantulum (Ta), is preferred to prevent the diffusion of aluminum or copper into adjacent dielectric materials which can cause electrical shorts to occur. If the barrier material itself does not provide sufficient wetting, then a separate wetting layer, such as titanium nitride (TiN) or tantulum nitride (TaN) may be deposited over the barrier layer prior to PVD metal deposition. Preferably, this process occurs in an integrated processing system including all metal processing chambers.

It has been demonstrated that some metals, such as aluminum (Al) and copper (Cu), can flow at temperatures below their respective melting points due to the effects of surface tension. However, these metals have a tendency to dewet from an underlying dielectric layer at high temperatures. Therefore, the present invention interposes a barrier/wetting layer between a metal layer and the dielectric to improve the wetting of the metal. An appropriate barrier/wetting layer is one that wets the metal better than the dielectric material. It is preferred that the barrier/wetting layer provide improved wetting even when only a thin barrier/wetting layer is deposited. It follows that a preferred barrier/wetting layer is formed substantially uniformly over the surface of the dielectric, including the walls and floor of the apertures.

According to the present invention, preferred barrier/wetting layers include such layers as a refractory (tungsten (W), niobium (Nb), aluminum silicates, etc.), tantalum (Ta), tantalum nitride (TaN), titanium nitride (TiN), PVD Ti/N$_2$-stuffed, a ternary compound (such as TiSiN, WSiN, etc.) or a combination of these layers. The most preferred barrier/wetting materials are Ta and TaN, which typically are provided as a PVD layer having a thickness between about 800 Å and about 1000 Å, or Ti and TiN, which typically are provided as either PVD or CVD layers having a thickness between about 100 Å and about 400 Å. The barrier/wetting layer is deposited to form a substantially continuous cap over the dielectric layer and may be treated with nitrogen to improve barrier properties or adhesion to adjacent layers. Alternatively, exposed surfaces of silicon can be treated with nitrogen to form a $Si_xN_y$ layer than is effective as a barrier layer for copper.

Following deposition of the barrier/wetting layer, the substrate is then positioned in a PVD Cu or PVD Al chamber to deposit a conformal metal layer at a pressure less than about 1 milliTorr and a substrate to target spacing of at least 100 mm. The chamber is preferably a PVD chamber operating at a pressure less than about 0.35 milliTorr. The conformal PVD metal layer has a blanket thickness of from about 200 Å to about 1 micron, preferably from about 4000 Å to about 6000 Å. Side wall thickness is typically 10% to 25% of the blanket thickness. Additional metal is then deposited by PVD in the same chamber or a different chamber and heated to reflow the deposited metal and fill the apertures leaving a planar surface that does not have grooves.

It is also preferred that the top surface of the stack receive a PVD TiN anti-reflection coating ("ARC") for reducing the reflectivity of the surface and improving the photolithographic performance of the layer.

One method of the present invention for metallization of a substrate aperture includes the sequential steps of pre-cleaning the substrate surface, depositing titanium in an ionized PVD process, i.e. high density plasma where the sputtered atoms are ionized, or collimated PVD process, depositing PVD Al in a sputtering chamber having a substrate to target spacing of at least 100 mm, depositing bulk aluminum in a PVD chamber, and reflowing the aluminum in the PVD chamber.

Figure 1:
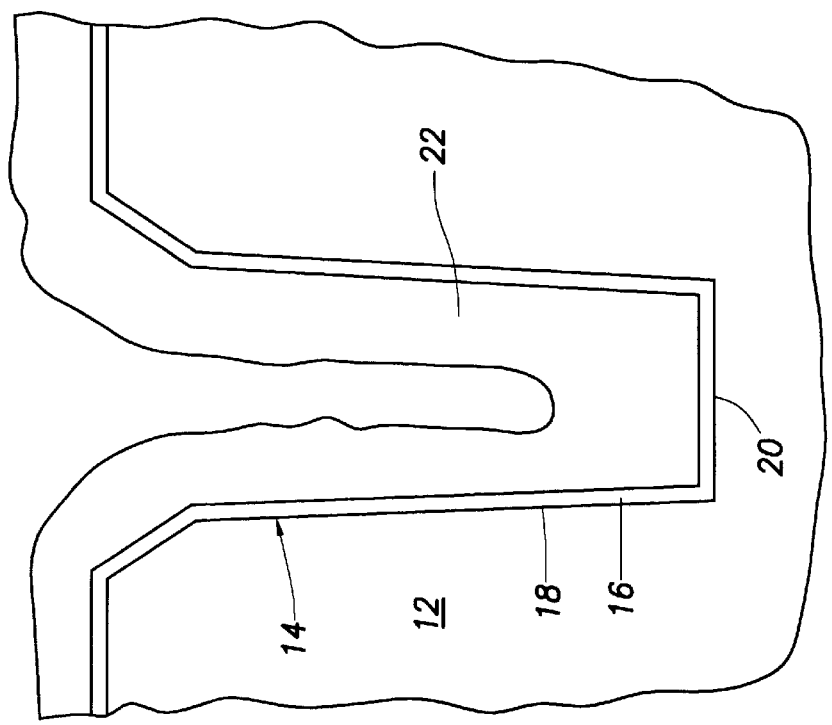
FIG. 1 is a schematic diagram of a metallized semiconductor substrate via according to the present invention having a barrier layer and a conformal PVD aluminum layer.

Referring now to FIG. 1, a schematic diagram of a substrate having a patterned dielectric layer 12 formed thereon is shown. The dielectric layer 12 has a via 14 having a high aspect ratio, i.e, a high ratio of via depth to via width, of about three (3), but the present invention may be beneficial in cooperation with vias having any aspect ratio. A thin titanium layer 16 is deposited directly onto the substrate covering substantially all surfaces of the dielectric layer 12 including the walls 18 and floor 20 of via 14. The thin titanium layer 16 will generally have a thickness of between about 5 Å and about 700 Å, with the preferred thickness being in the range between about 100 Å and about 200 Å. A conformal PVD Al layer 22 is deposited on the titanium layer 16 to a desired thickness not to exceed the thickness which would seal the top of the contact or via. The conformal PVD Al layer 22 may be deposited in a sputtering chamber that holds a substrate at a distance of at least about 100 mm from an Al target.

Referring now to FIG. 2, the via 14 is filled with Al by reflowing a bulk PVD Al layer 23 deposited on the conformal PVD Al layer (layer 22 of FIG. 1). An integrated PVD Al layer 24 will result from integrating the bulk PVD Al layer 23 that is deposited onto the conformal PVD Al layer 22. The bulk PVD Al may contain certain dopants, and upon deposition the bulk PVD Al layer 23 may integrate with the conformal PVD Al layer 22 so that the dopant is dispersed throughout much of the integrated PVD Al layer 24. In general, the integrated PVD Al layer 24 does not need to be doped. The top surface 26 of the integrated PVD Al layer 24 is substantially planarized. Because the titanium layer 16 provides good wetting of the conformal PVD Al layer 22, the dielectric layer or substrate temperature during deposition of PVD Al may be from about room temperature to about 500° C.

The Apparatus

Figure 3:
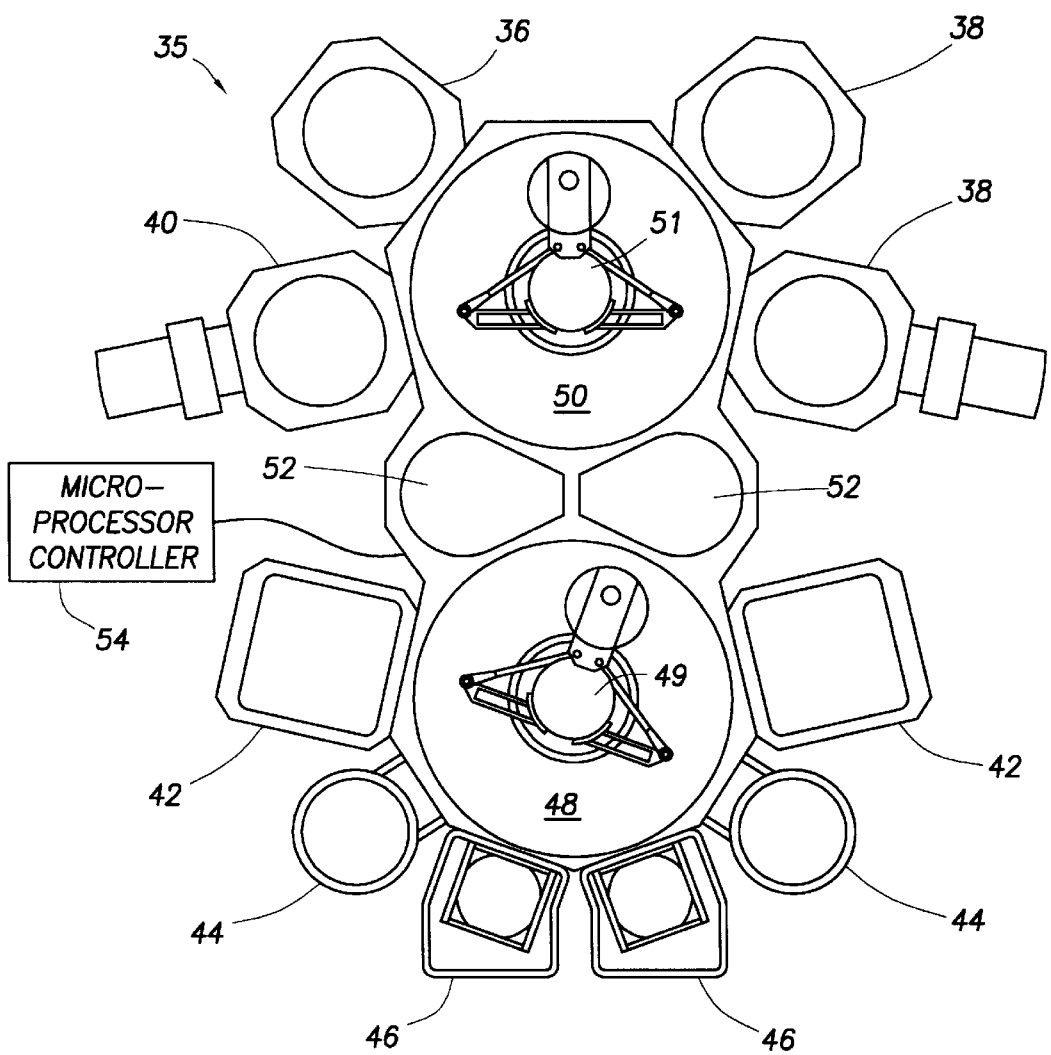
FIG. 3 is a schematic top view of an integrated multichamber apparatus suitable for depositing a barrier layer and a conformal PVD layer on a semiconductor substrate via, and suitable for filling the via with PVD metal.

The metal deposition process of the present invention is preferably carried out in a multichamber processing apparatus or cluster tool having a PVD chamber capable of being operated at a pressure below about 0.35 milliTorr. A schematic of a multichamber processing apparatus 35 suitable for performing the processes of the present invention is illustrated in FIG. 3. The basic apparatus is an "ENDURA" system commercially available from Applied Materials, Inc., Santa Clara, Calif. A similar staged-vacuum wafer processing system is disclosed in U.S. Pat. No. 5,186,718, entitled Staged-Vacuum Wafer Processing System and Method, Tepman et al., issued on Feb. 16, 1993, which is hereby incorporated herein by reference. The particular embodiment of the apparatus 35 shown herein is suitable for processing planar substrates, such as semiconductor substrates, and is provided to illustrate the invention, and should not be used to limit the scope of the invention. The apparatus 35 typically comprises a cluster of interconnected process chambers including at least one long throw PVD metal chamber. For the present invention, the apparatus 35 preferably includes a PVD Al chamber 36 having a substrate to target spacing of at least 100 mm for depositing conformal PVD Al layers, and two additional PVD Al chambers 38 for depositing and reflowing PVD Al layers. The apparatus 35 may further comprise a PVD Ti chamber 40 or another barrier/wetting layer chamber, two pre-clean chambers 42 for removing contaminants (such as PreClean II chambers available from Applied Materials), two degas chambers 44, and two load lock chambers 46. The apparatus 35 has two transfer chambers 48, 50 containing transfer robots 49, 51, and two cooldown chambers 52 separating the transfer chambers 48, 50. The apparatus 35 is automated by programming a microprocessor controller 54 as described in more detail below. However, the process could also be operated by individual chambers, or a combination of the above.

The PVD Chambers

Figure 4:
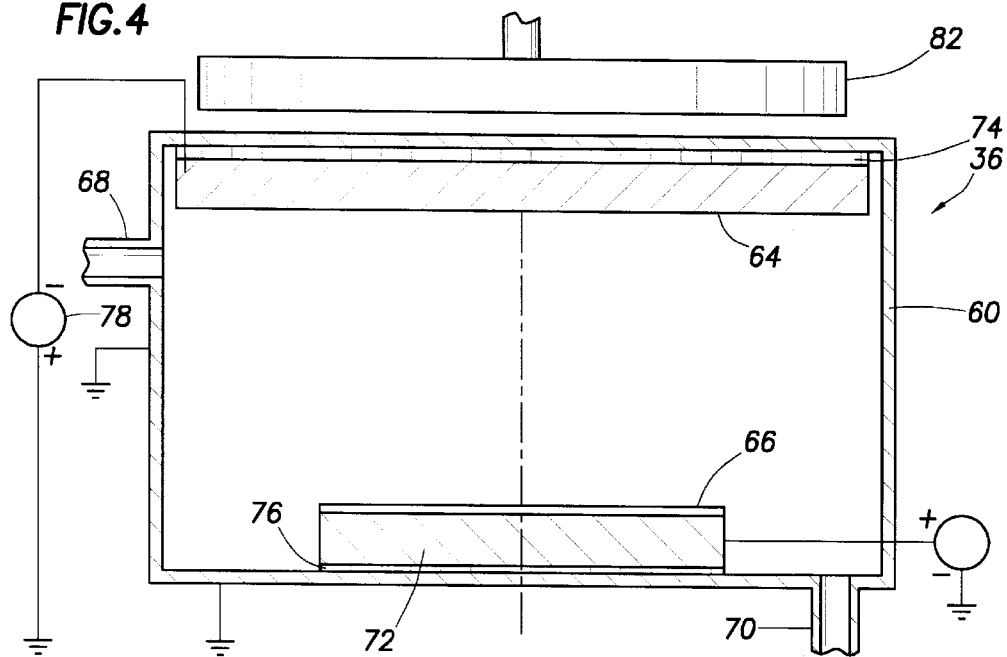
FIG. 4 is a schematic diagram of a PVD chamber suitable for depositing a conformal metal layer at a pressure less than about 1 milliTorr.

Referring to FIG. 4, a preferred long throw PVD chamber 36 is shown in more detail. A sputtering target 64 and a semiconductor substrate 66 are contained within a grounded enclosure wall 60, which may be a chamber wall as shown or a grounded shield. The target 64 and the substrate are separated by a long throw distance of at least about 100 mm, preferably from about 150 mm to about 190 mm. The long throw chamber may also contain a collimator (not shown) between the target 64 and the substrate 66 if needed to provide a more uniform and symmetrical flux of deposition material to each location on the substrate 66. Collimators that may be used in the PVD chamber are described in U.S. Pat. No. 6,139,697, which description is incorporated by reference herein.

Referring still to FIG. 4, the chamber 36 generally includes at least one gas inlet 68 connected to a gas source (not shown) and an exhaust outlet 70 connected to an exhaust pump (not shown). A substrate support pedestal 72 is disposed at one end of the enclosure wall 60, and the sputtering target 64 is mounted to the other end of the enclosure wall 60. The target 64 is electrically isolated from the enclosure wall 60 by an insulator 74 so that a negative voltage may be applied and maintained on the target with respect to the grounded enclosure wall 60. The substrate support pedestal 72 is also electrically isolated from the enclosure wall 60 by an insulator 76, so that a positive voltage may be applied and maintained on the substrate and/or the support pedestal 72 with respect to the grounded enclosure wall 60. In operation, the substrate 66 is positioned on the support pedestal 72 and a plasma is generated in the chamber 36.

During the deposition process of the conformal PVD metal layer according to the present invention, a process gas comprising a non-reactive species such as Ar, is charged into the PVD chamber 36 through the gas inlet 68 at a selected flow rate regulated by a mass flow controller (not shown). The chamber pressure is controlled by varying the rate that process gases are pumped through the exhaust outlet 70 and is maintained below about 1 milliTorr to promote deposition of conformal PVD metal layers, preferably from about 0.2 milliTorr to about 0.5 milliTorr.

A power source, such as a D.C. power supply 78, applies a negative voltage to the target 64 with respect to the enclosure wall 60 so as to excite the gas into a plasma state. Ions from the plasma bombard the target 64 and sputter atoms and larger particles of target material from the target 64. The particles sputtered from the target 64 travel along linear trajectories from the target 64, and a portion of the particles collide with, and deposit on, the substrate 66.

A conventional magnetron sputtering source employs a rotating magnet 82 above the target 64 to trap electrons adjacent the target and thereby increase the concentration of plasma ions adjacent to the sputtering surface of the target 66. Rotation of the magnetron 82 during sputtering of the target 64 results in a radially symmetric target erosion profile.

Figure 5:
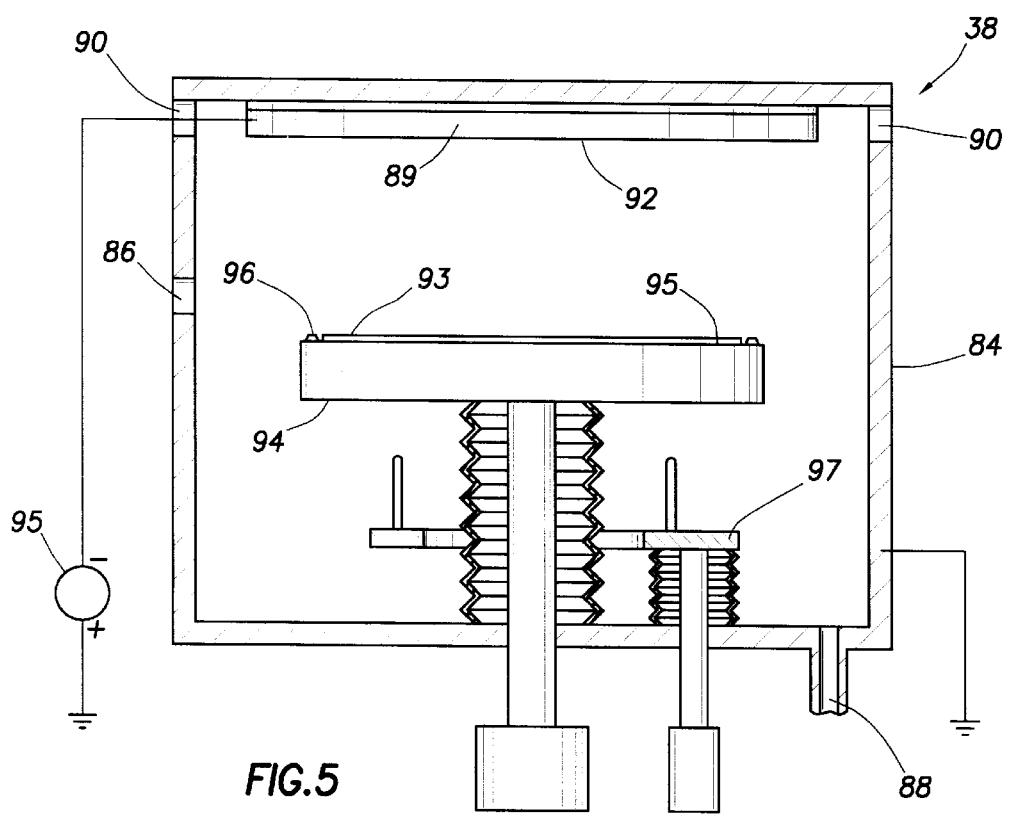
FIG. 5 is a schematic diagram of a PVD chamber suitable for depositing a bulk metal layer at a pressure greater than about 2 milliTorr.

FIG. 5 is a schematic cross-sectional view of a PVD chamber 38 suitable for performing a PVD processes of the present invention. The chamber 38 generally includes a grounded enclosure wall 84, having at least one gas inlet 86 and an exhaust outlet 88 connected to an exhaust pump (not shown). A PVD target 89 is isolated from the grounded enclosure wall 84 by an insulator 90. The PVD target 89 provides a sputtering surface 92 for depositing material on a substrate 93 positioned on a support member, such as a moveable pedestal 94. The pedestal 94 includes a generally planar surface 95 having positioning pins 96 for receiving the substrate 93 thereon. A negative voltage may be maintained on the target 89 with respect to the grounded enclosure wall 84 by a DC power source 95.

A lift pin mechanism 97 raises and lowers the substrate 93 with respect to the pedestal 94 while the pedestal is in a retracted position. The pedestal 94 extends to place the substrate 93 adjacent the target during deposition of metal layers such as aluminum. The pedestal 94 can be heated or cooled to control the substrate temperature.

Control Systems

Figure 6:
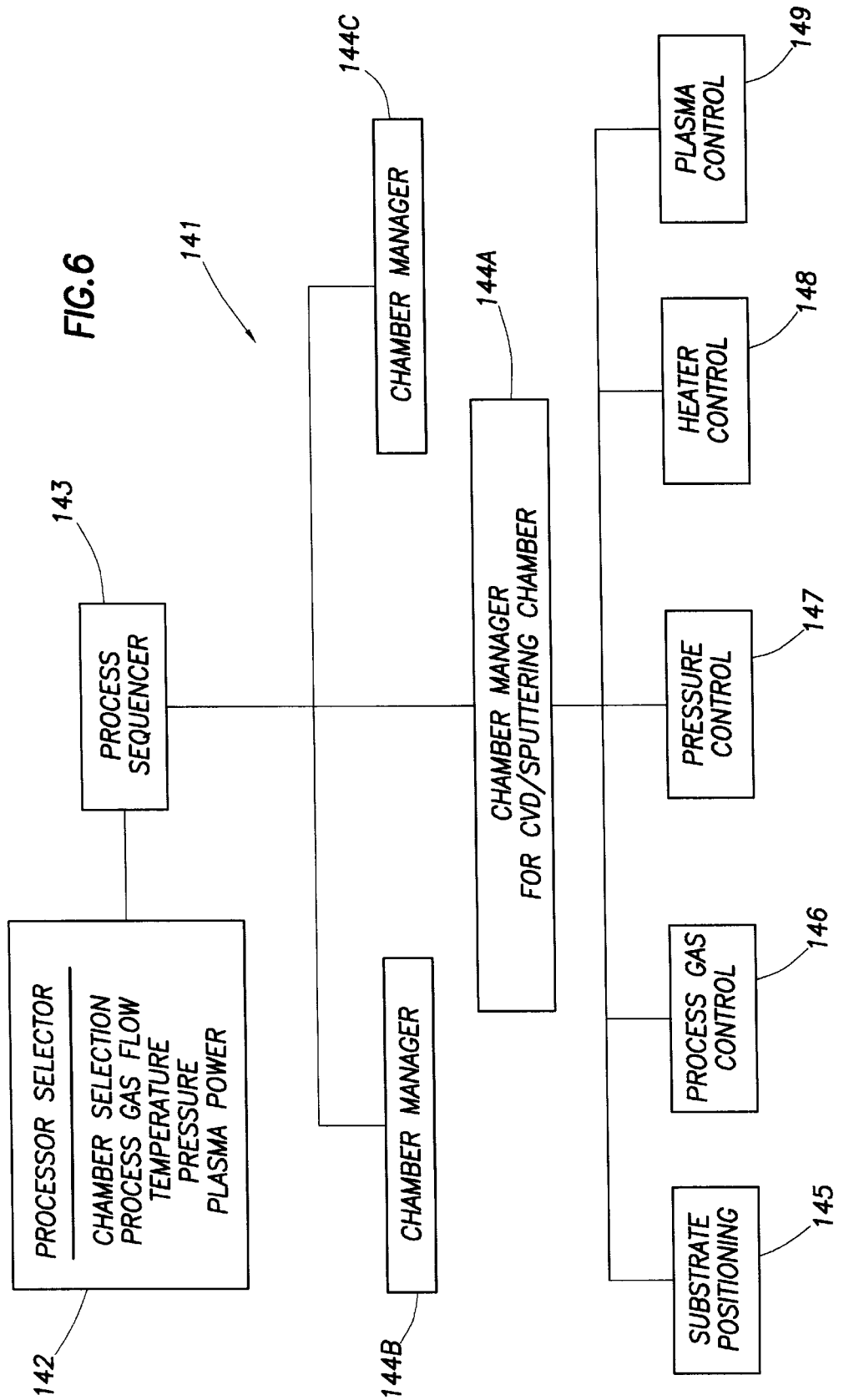
FIG. 6 is a simplified block diagram showing the hierarchical control structure of a computer program suitable for controlling a process of the present invention.

Referring to FIG. 6, the processes of the present invention can be implemented using a computer program product 141 that runs on a conventional computer system comprising a central processor unit (CPU) interconnected to a memory system with peripheral control components, such as for example a 68400 microprocessor, commercially available from Synenergy Microsystems, California. The computer program code can be written in any conventional computer readable programming language such as for example 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

FIG. 6 shows an illustrative block diagram of the hierarchical control structure of the computer program 141. A user enters a process set and process chamber number into a process selector subroutine 142. The process sets are predetermined sets of process parameters necessary to carry out specified processes in a specific process chamber, and are identified by predefined set numbers. The process parameters relate to process conditions such as, for example, process gas composition and flow rates, temperature, pressure, plasma conditions such as cooling gas pressure, and chamber wall temperature.

A process sequencer subroutine 143 comprises program code for accepting the identified process chamber and set of process parameters from the process selector subroutine 142, and for controlling operation of the various process chambers. Multiple users can enter process set numbers and process chamber numbers, or a user can enter multiple process set numbers and process chamber numbers, so the sequencer subroutine 143 operates to schedule the selected processes in the desired sequence. Preferably the sequencer subroutine 143 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer subroutine 143 can be designed to take into consideration the present condition of the process chamber being used in comparison with the desired process conditions for a selected process, or the "age" of each particular user entered request, or any other relevant factor a system programmer desires to include for determining scheduling priorities.

Once the sequencer subroutine 143 determines which process chamber and process set combination is going to be executed next, the sequencer subroutine 143 causes execution of the process set by passing the particular process set parameters to the chamber manager subroutines 144A–C which control multiple processing tasks in different process chambers according to the process set determined by the sequencer subroutine 143. For example, the chamber manager subroutine 144A comprises program code for controlling CVD process operations, within the described process chamber 36 of FIG. 4, The chamber manager subroutine 144 also controls execution of various chamber component subroutines or program code modules, which control operation of the chamber components necessary to carry out the selected process set. Examples of chamber component subroutines are substrate positioning subroutine 145, process gas control subroutine 146, pressure control subroutine 147, heater control subroutine 148, and plasma control subroutine 149.

In operation, the chamber manager subroutine 144A selectively schedules or calls the process component subroutines in accordance within the particular process set being executed. The chamber manager subroutine 144A schedules the process component subroutines similarly to how the sequencer subroutine 143 schedules which process chamber 36 and process set is to be executed next. Typically, the chamber manager subroutine 144A includes steps of monitoring the various chamber components, determining which components needs to be operated based on the process parameters for the process set to be executed, and causing execution of a chamber component subroutine responsive to the monitoring and determining steps.

EXAMPLE 1

The apparatus of FIG. 3 was used to fill apertures on the surface of a semiconductor substrate. The apertures were precleaned to remove about 400 Å of material including any oxides or other contaminants and then transferred to a PVD Ti chamber for deposition of about 400 Å of a conformal titanium layer. The substrate wNas then transferred to a PVD chamber 36 wherein the target to substrate distance is greater than 150 mm for deposition of a conformal aluminum layer of about 4000 Å at a chamber pressure of about 0.35 milliTorr. Deposition of aluminum commenced at room temperature. The substrate was then transferred to an additional PVD Al chamber 38 for deposition of about 4000 Å of bulk aluminum at less than 350° C. with power input exceeding 10 kW at a target to substrate spacing of less than 100 mm. The aluminum layers (conformal and bulk) were then heated in the additional chamber 38 for reflow of aluminum to fill the apertures. The temperature of the substrate during reflow was maintained below 500° C. The surface of the aluminum after reflow was free of channels and the apertures were free of voids. The aluminum surface had excellent reflectivity and uniformity.

EXAMPLE 2 (Comparison)

The apparatus of FIG. 3 was used to fill apertures on the surface of a semiconductor substrate for comparison to Example 1. The apertures were precleaned to remove about 400 Å of material including any oxides or other contaminants and then transferred to a PVD Ti chamber for deposition of about 400 Å of a conformal titanium layer. The substrate was then transferred to PVD chamber 36 having a target to substrate distance greater than 100 mm for deposition of an aluminum layer having a blanket thickness of about 8000 Å. The aluminum layer was deposited at a chamber pressure of about 0.35 milliTorr and was not conformal. The aluminum layer was then heated in the chamber 36 to reflow the aluminum and fill the apertures. The temperature of the substrate during reflow was maintained below 500° C. The surface of the aluminum after reflow included small grooves although the apertures were free of voids. The aluminum surface had similar reflectivity and reduced uniformity in comparison to the aluminum surface of Example 1.

The process of the present invention provides excellent step coverage for filling high aspect ratio apertures with a conformal layer of metal deposited by PVD at a pressure less than about 1 milliTorr, preferably less than about 0.35 milliTorr, and a metal layer deposited by PVD to fill the apertures. The deposited metal layers produce a uniform surface having reduced surface trenching.

While the foregoing is directed to embodiments of the present invention, other and further embodiments of the invention may be devised without departing from the basic scope thereof. The scope of the invention is determined by the claims that follow.

What is claimed is:

1. A method of forming a feature on a substrate, comprising:
   a) depositing a barrier/wetting layer over the surfaces of an aperture in the substrate, the barrier/wetting layer having a thickness of between about 5 and about 700 Angstroms;
   b) physical vapor depositing a conformal metal layer over the surface of the barrier/wetting layer without capping or filling the aperture at a chamber pressure less than about 1 milliTorr, the physical vapor deposited conformal metal layer having a thickness between about 200 Angstroms and about 1 micron; and
   c) physical vapor depositing a bulk metal layer on the conformal metal layer at a temperature below 350° C.

2. The method of claim 1, further comprising reflowing the bulk metal layer into the aperture.

3. The method of claim 1, wherein a) through c) are performed sequentially in an integrated processing system with a common vacuum mainframe.

4. The method of claim 1, wherein a) through c) are performed in separate chambers.

5. The method of claim 1, wherein the conformal metal layer is not exposed to air prior to filling the aperture.

6. The method of claim 1, wherein the conformal metal layer is formed by sputtering from a target located from about 150 mm to about 190 mm from the substrate.

7. The method of claim 1, wherein the conformal metal layer and the bulk metal layer are aluminum layers.

8. The method of claim 1, wherein the conformal metal layer is deposited at about room temperature.

9. The method of claim 1, wherein the bulk metal layer is deposited with a power input exceeding 10 kw.

10. The method of claim 1, wherein the bulk metal layer is reflowed at a temperature less than 500° C.

11. A process for filling a via, trench, or dual damascene structure on a substrate, comprising:
    a) depositing a conformal barrier/wetting layer on the substrate;
    b) depositing a conformal PVD metal layer over the barrier/wetting layer at a chamber pressure less than about 1 milliTorr;
    c) depositing a bulk PVD metal layer on the conformal PVD metal layer at a temperature below 350° C.; and
    d) reflowing the bulk PVD metal layer.

12. The process of claim 11, wherein the conformal PVD metal layer has a blanket thickness from about 200 Angstroms to about 1 micron.

13. The process of claim 12, wherein the barrier/wetting layer has a thickness from about 5 Angstroms to about 700 Angstroms.

14. The process of claim 11, wherein the barrier/wetting layer is titanium.

15. The process of claim 11 wherein the barrier/wetting layer is selected from a group consisting of tungsten (W), niobium (Nb), aluminum silicates, tantalum (Ta), tantalum nitride (TaN), titanium nitride (TiN), PVD Ti/$N_2$-stuffed, TiSiN, WSiN, or a combination thereof.

16. The process of claim 11, wherein the conformal PVD metal layer is a conformal PVD aluminum layer.

17. The process of claim 11, wherein the bulk PVD metal layer is maintained at a temperature less than 500° C. while reflowing the bulk metal layer.

18. The process of claim 11, wherein the conformal PVD metal layer is sputtered from a target located from about 150 mm to about 190 mm from the substrate.

19. The process of claim 16, wherein the conformal PVD metal layer is sputtered at a chamber pressure less than about 0.35 milliTorr.

20. A controller for a multi-chamber processing apparatus for performing physical vapor deposition processes, wherein the controller contains programming which, when executed, configures the controller to perform operations of forming a feature on a substrate, the operations comprising:

depositing a conformal barrier/wetting layer on the substrate;

depositing a conformal PVD metal layer over the barrier/wetting layer at a chamber pressure less than about 1 milliTorr;

depositing a bulk PVD metal layer on the conformal PVD metal layer at a temperature below 350° C.; and reflowing the bulk PVD metal layer.

21. The controller of claim 20, wherein the conformal PVD metal layer has a blanket thickness from about 200 Angstroms to about 1 micron.

22. The controller of claim 21, wherein the barrier/wetting layer has a thickness from about 5 Angstroms to about 700 Angstroms.

23. The controller of claim 20, wherein the barrier/wetting layer is titanium.

24. The controller of claim 20, wherein the barrier/wetting layer is selected from a group consisting of tungsten (W), niobium (Nb), aluminum silicates, tantalum (Ta), tantalum nitride (TaN), titanium nitride (TiN), PVD Ti/$N_2$-stuffed, TiSiN, WSiN, or a combination thereof.

25. The controller of claim 20, wherein the conformal PVD metal layer is a conformal PVD aluminum layer.

26. The controller of claim 20, wherein the bulk PVD metal layer is maintained at a temperature less than 500° C. while reflowing the bulk metal layer.

27. The controller of claim 20, wherein the conformal PVD metal layer is sputtered from a target located from about 150 mm to about 190 mm from the substrate.

28. The controller of claim 27, wherein the conformal PVD metal layer is sputtered at a chamber pressure less than about 0.35 milliTorr.

* * * * *

UNITED STATES PATENT AND TRADEMARK OFFICE
CERTIFICATE OF CORRECTION

PATENT NO.     : 6,352,620 B2
DATED          : March 5, 2002
INVENTOR(S)    : Yu et al.

It is certified that error appears in the above-identified patent and that said Letters Patent is hereby corrected as shown below:

<u>Column 8,</u>
Line 47, please change "wNas" to -- was --.

Signed and Sealed this

Nineteenth Day of August, 2003

JAMES E. ROGAN
*Director of the United States Patent and Trademark Office*